United States Patent [19]

Ohtsuka et al.

[11] Patent Number: 5,244,535
[45] Date of Patent: Sep. 14, 1993

[54] METHOD OF MANUFACTURING A SEMICONDUCTOR DEVICE INCLUDING PLASMA TREATMENT OF CONTACT HOLES

[75] Inventors: Minoru Ohtsuka, Tsuchiurashi; Kazutoshi Taira, Tsukubashi, both of Japan

[73] Assignee: Texas Instruments Incorporated, Dallas, Tex.

[21] Appl. No.: 850,594

[22] Filed: Mar. 13, 1992

[30] Foreign Application Priority Data

Mar. 15, 1991 [JP] Japan ................... 3-075694

[51] Int. Cl.⁵ .................. H01L 21/283; H01L 21/321
[52] U.S. Cl. ...................... 156/643; 156/646; 156/653; 156/656; 437/194; 437/195; 437/946
[58] Field of Search ............... 156/643, 653, 657, 646, 156/656; 437/194, 198, 946, 195

[56] References Cited

U.S. PATENT DOCUMENTS

| 4,426,246 | 1/1984 | Kravitz et al. | 156/643 |
|---|---|---|---|
| 4,430,152 | 2/1984 | Okano | 156/643 |
| 4,523,975 | 6/1985 | Groves et al. | 156/643 |
| 4,547,260 | 10/1985 | Takada et al. | 156/643 |
| 4,592,800 | 6/1986 | Landau et al. | 156/643 |
| 4,668,335 | 5/1987 | Mockler et al. | 156/643 |
| 4,687,543 | 8/1987 | Bowker | 156/643 |
| 4,698,128 | 10/1987 | Berglund et al. | 156/643 |
| 4,731,156 | 3/1988 | Montmarquet | 156/643 |
| 4,749,440 | 6/1988 | Blackwood et al. | 156/646 |
| 4,786,352 | 11/1988 | Benzing | 156/345 |
| 4,806,199 | 2/1989 | Gualandus | 156/643 |
| 4,863,561 | 9/1989 | Freeman et al. | 156/646 |
| 4,957,590 | 9/1990 | Douglas | 156/643 |
| 4,985,113 | 1/1991 | Fujimoto et al. | 156/643 |
| 5,007,981 | 4/1991 | Kawasaki et al. | 156/643 |
| 5,035,751 | 7/1991 | Nagashima et al. | 134/22.1 |
| 5,062,900 | 11/1991 | Berneron et al. | 148/4 |
| 5,100,504 | 3/1992 | Kawai et al. | 156/643 |
| 5,126,008 | 6/1992 | Levy | 156/665 |
| 5,176,790 | 1/1993 | Arleo et al. | 156/643 |

Primary Examiner—T. N. Quach
Attorney, Agent, or Firm—William E. Hiller; Richard L. Donaldson

[57] ABSTRACT

Method of making a semiconductor device, wherein an etchant gas is employed to etch a contact hole through an insulation layer overlying a conduction layer as disposed on a substrate of semiconductor material such that a surface portion of the conduction layer is selectively exposed by the formation of the contact hole through the overlying insulation layer. Normally, the etchant gas as so employed will have a tendency to react with the underlying conduction layer so as to form reaction products on the selectively exposed surface portion of the conduction layer increasing the contact resistance thereof. The method involves flooding the etched contact hole immediately following its formation with a gaseous medium covering the area of the selectively exposed surface portion of the conduction layer, wherein the gaseous medium is capable of inhibiting the formation of reaction products on the selectively exposed surface portion of the conduction layer from the original etchant gas. The formation of resistance-increasing reaction products on the selectively exposed surface portion of the conduction layer is thereby suppressed such that an undesirable increase in contact resistance is avoided. In a specific aspect, the etchant gas is a fluorine-based gaseous plasma, and the reaction product-inhibiting gaseous medium is a nitrogen-containing plasma.

6 Claims, 4 Drawing Sheets

METHOD OF MANUFACTURING A SEMICONDUCTOR DEVICE INCLUDING PLASMA TREATMENT OF CONTACT HOLES

BACKGROUND OF THE INVENTION

1. Field of the Invention

The present invention pertains to a method for manufacturing a semiconductor device in which a fluorine-based gas is employed to etch contact holes followed by treatment of the etched contact holes with a nitrogen-containing plasma as a means of preventing the formation of reaction products from the etching procedure.

2. Description of the Prior Art

Semiconductor devices have a laminated structure, such as that shown in FIG. 20. Specifically, the semiconductor device is formed as a laminated structure, in which an $SiO_2$ primary insulation layer 2, an aluminum-copper alloy conduction layer 3, and an $SiO_2$ secondary insulation layer 4 are adhered in that sequence to a semiconductor wafer or substrate 1 of monocrystalline silicon. The conduction layer 3 is connected to an $N^+$ region 1a of the P-type substrate 1 via thru-holes 2a, which are formed in the primary insulation layer 2. Thru-holes 4a are formed in the secondary insulation layer 4; the conduction layer 3 is connected to a bonding-pad conduction layer 5, which is attached to the secondary insulation layer 4, and extends through the thru-holes 4a into engagement with the conduction layer 3. A silicon nitride or silicon nitride/silicon dioxide protection layer 37 is attached to the bonding-pad conduction layer 5. A bonding pad 5a is provided at a location facing an opening 37a in the protection layer 37, which is formed by a standard photolithographic procedure. Thus, the bonding pad 5a is electrically connected to the $N^+$ region 1a of the substrate 1 through the conduction layer 3. Although there are other elements that are connected to the bonding pad by bonding wire, these other elements are not shown in FIG. 20.

The thru-holes 4a in the secondary insulation layer 4 are typically formed by dry etching through plasma etching with a fluorine-based gas such as $C_2F_6/CHF_3$ or $CF_4$. However, when plasma etching is carried out using a fluorine-based gas, exposure to air after the etching procedure is believed to generate, in several seconds, $AlF_m(OH)_{3-m}$ 56 in a location facing the thru-hole 4a on the surface of the conduction layer 3. Thus, there is an increase in contact resistance between the conduction layer 3 and the bonding-pad conduction layer 5 formed afterward. Thus, following the formation of the contact holes 4a, it is necessary to form the bonding-pad conduction layer 5 immediately, which is extremely problematic in terms of procedure control. The aforementioned $AlF_m(OH)_{3-m}$ is believed to form on the aluminum-copper alloy conduction layer 3 by a reaction between water in the air and residual fluorine. This reaction product is problematic in that it is difficult to distinguish it from the reaction products generated during other dry etching processes that involve chlorine-based gas. Below, the product generated on the surface of the aluminum alloy conduction layer in air after the fluorine-based gas plasma etching treatment (believed to be $AlF_m(OH)_{3-m}$) will be referred to simply as "product."

It is an object of the present invention to provide a manufacturing method for making a semiconductor device wherein it is possible to control the generation of substances in the air, which are generated immediately following contact hole formation and which are a cause of increased contact resistance in the area of the contact hole. In this way, it will be possible, after the formation of the contact hole, to form, with sufficient freedom with respect to time, a conductive component connected through the contact hole, while preventing an increase in electrical resistance.

SUMMARY OF THE INVENTION

The present invention pertains to a method for making a semiconductor device which includes forming an insulation layer on top of a conduction layer adhered to a semiconductor substrate; forming contact holes by etching the aforementioned insulation layer with a fluorine-based gas; and converting a gas containing nitrogen to a plasma and using the obtained plasma to treat at least the aforementioned contact holes.

DESCRIPTION OF THE PREFERRED EMBODIMENTS

Figure 20:
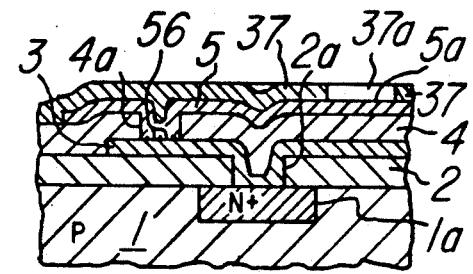
FIG. 20 is an enlarged partial cross-sectional view, of a semiconductor device as made in accordance with a conventional method.

FIGS. 1–6 enlarged partial cross sections that illustrate the order of procedure in making a semiconductor device (in the present example, CMOS logic and MOS memory (DRAM)). The components of the semiconductor device identical with those in FIG. 20 are shown by the same reference numberals.

Figure 1:
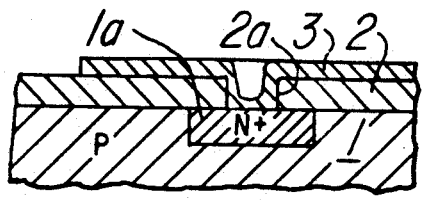
FIG. 1 is an enlarged partial cross-sectional view of an early stage in the method of making a semiconductor device in accordance with the present invention.

In FIG. 1, the $SiO_2$ primary insulation layer 2 is formed on the semiconductor substrate 1 which is of P-type silicon and has an N+ region 1a formed therein, after which a contact hole 2a is formed in the primary insulation layer 2 in registration with the N+ region 1a of the substrate. Next, an aluminum-copper alloy (2 wt % Cu) conduction layer 3, which contains a TiW layer to function as a barrier metal, is adhered to the primary insulation layer 2, and the conduction layer 3 is connected to the N+ region 1a of the substrate 1 through the contact hole 2a. The copper, which is an alloying element, functions by reducing stress and electromigration in the conduction layer 3. The primary insulation layer 2 is formed by chemical vapor deposition (CVD), while the conduction layer 3 is formed by a standard photolithographic procedure. The contact hole 2a is formed by plasma etching using a fluorine-based gas.

Figure 2:
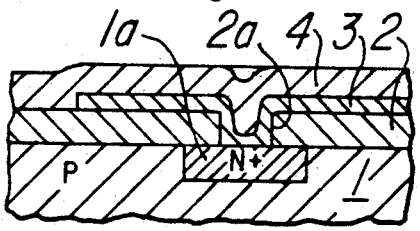
FIG. 2 is an enlarged partial cross-sectional view similar to FIG. 1, but illustrating a subsequent procedure in the method of making a semiconductor device.

Next, as shown in FIG. 2, the $SiO_2$ secondary insulation layer 4 is formed on the conduction layer 3 by CVD.

Figure 4:
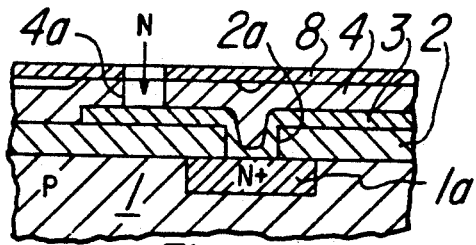
FIG. 4 is an enlarged partial cross-sectional view showing a further procedure, subsequent to that shown in FIG. 3, of the method of making a semiconductor device.
Figure 5:
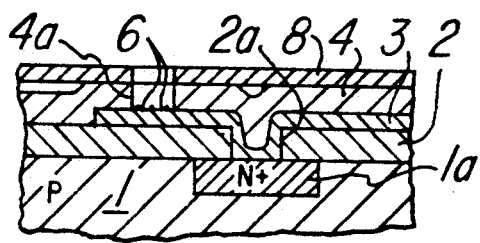
FIG. 5 is an enlarged partial cross-sectional view showing a further procedure, subsequent to that shown in FIG. 4, of the method of making a semiconductor device.
Figure 3:
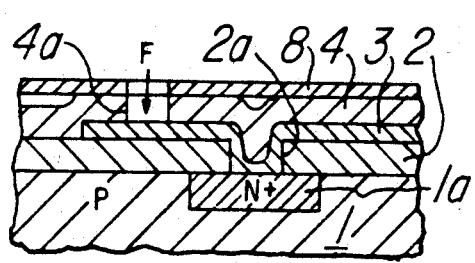
FIG. 3 is an enlarged partial cross-sectional view showing a further procedure, subsequent to that shown in FIG. 2, of the method of making a semiconductor device.

Next, as shown in FIG. 3, a photoresist layer 8 patterned to provide an opening therethrough is employed as a mask in conjunction with plasma etching with the fluorine gas to form the thru-hole 4a of the secondary insulation layer 4. Next, immediately following this, a plasma treatment using nitrogen gas is carried out, as shown in FIG. 4, with the same plasma etching device. Next, as shown in FIG. 5, AlN 6 is generated at a location in which the conduction layer 3 is exposed by the thru-hole 4a. This AlN can be distinguished from the reaction products generated during the chlorine-based gas etching procedure. The plasma treatment in the procedure illustrated in FIG. 4 will be explained in detail below.

Figure 6:
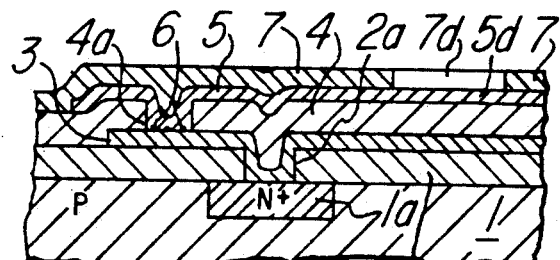
FIG. 6 is an enlarged partial cross-sectional view showing a final procedure, subsequent to that shown in FIG. 5, of the method of making a semiconductor device.

Next, as shown in FIG. 6, a standard procedure is used to adhere the bonding-pad conduction layer 5 to the secondary insulation layer 4. The bonding-pad conduction layer 5 is formed by a standard photolithographic procedure. Thus, the bonding-pad conduction layer 5 is electrically connected via the conduction layer 3 to the N+ region 1a of the substrate 1. Next, a tantalum oxide ($Ta_2O_5$) insulation-protection layer 7 is adhered to the bonding-pad conduction layer and an opening 7a is formed through the insulation-protection layer 7 by standard photolithographic and etching procedures. Next, a bonding pad 5a is formed in a location in which the bonding-pad conduction layer 5 is exposed by the opening 7a.

The treatment conditions used in the procedure illustrated in FIG. 4 are as shown in Table I below.

TABLE I

| Devices | Drytec 384 T and GCA WE-616 TRIODE ETCHSYSTEM |
| --- | --- |
| Nitrogen gas supply | 170 cc/min (constant) |
| High-frequency output | 100–600 W (400–500 W in the present example) |
| Nitrogen gas pressure | 300 mtorr (constant) |
| Helium gas (for cooling wafer from below) | 7 torr, 10 torr, (constant) (GCA) (384T) |
| Electrode temperatures | 5° C. (384 T), 12° C. (GCA) (−constant) |
| High-frequency mode | RIE full mode (constant) |
| Bias (Vdc) | −360 to −900 V (−700 to −900 V in the present example) |
| Treatment time | 5 sec or longer (15–200 sec in the present example) |

Figure 7:
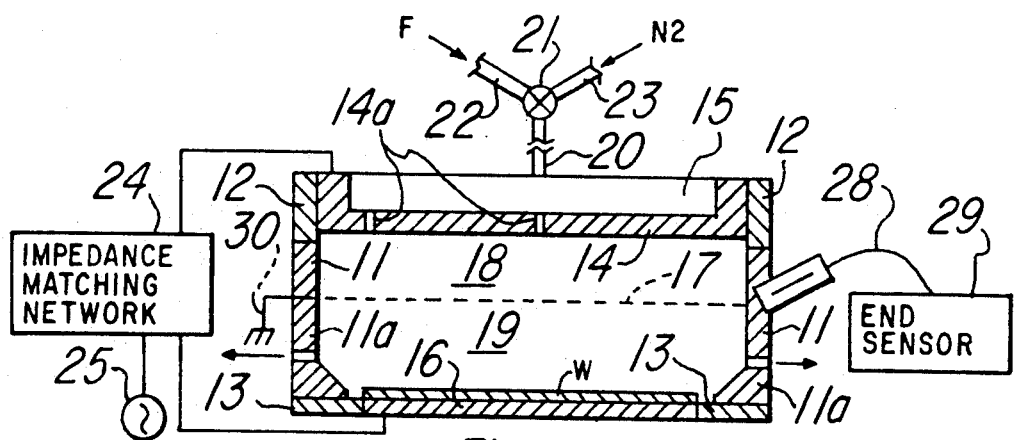
FIG. 7 is a schematic cross-sectional view of an apparatus for applying a plasma treatment to a semiconductor substrate.
Figure 8:
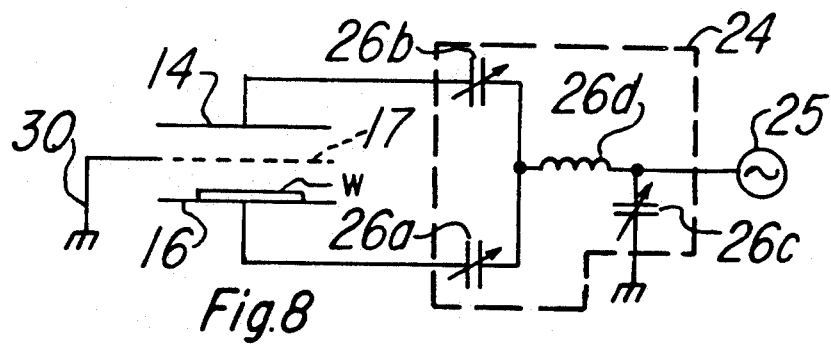
FIG. 8 is a schematic view of an electrical circuit showing components of the apparatus illustrated in FIG. 7.

FIG. 7 is a schematic cross section of a Drytek 384 T device as referred to in Table I and FIG. 8 is a schematic diagram of the same. Referring to FIG. 7, a plasma etching apparatus having a housing comprising insulating walls 12 and 13 connected to the top and bottom, respectively, of a side wall 11 is illustrated. To the upper insulating wall 12 are fastened a gas supply member 15 and a connected upper electrode 14, in which are formed a number of thru-holes 14a. A lower electrode 16 is fastened to the lower insulating wall 13 and a wafer W is adapted to be placed on the lower electrode 16. A grid 17 is disposed between the upper and lower electrodes 14 and 16. An upper chamber 18 is formed between the upper electrode 14 and the grid 17, while a lower chamber 19 is formed between the grid 17 and the lower electrode 16.

A high-frequency oscillator 25 is connected to the upper and lower electrodes 14 and 16 via an impedance-matching box 24, which contains a matching network. One end of the grid 17 is connected to a grounded circuit 30, while the other end is connected via an optical fiber cable 28 to an end sensor 29.

A gas supply pipe 20 is connected to the gas supply member 15, and branch pipes 22 and 23 are connected to the gas supply pipe 20 through a switching valve 21. During plasma etching (the procedure illustrated in FIG. 3), the fluorine-based gas passes through the branch pipe 22, gas supply pipe 20, gas supply member 15, and thru-holes 14a of the upper electrode 14 to enter the upper chamber 18; the fluorine-based gas then passes through the grid 17 and enters the lower chamber 19, after which it is discharged from the apparatus through a gas discharge outlet 11a formed in the side wall 11. During the nitrogen gas treatment (the procedure illustrated in FIG. 4), the nitrogen gas is supplied to the device through the branch pipe 23 and passes through and is discharged from the apparatus in the same manner as the fluorine gas, i.e., through the discharge outlet 11a.

As shown in FIG. 8, the impedance-matching box 24 is formed by connections to the upper and lower electrodes 14 and 16 via variable capacitors 26b and 26a from a variable capacitor 26c and coil 26d, which are connected to the high-frequency oscillator 25.

Polymers containing fluorine and carbon are generated in the upper chamber 18 and accumulate on the sides of the contact holes, thereby forming tapered surfaces that constrict in diameter toward the bottoms of the contact holes. This ensures that the contact holes will be filled with the bonding pad material in the subsequent deposition of the bonding-pad conduction layer 5 onto the secondary insulation layer 4, thereby increasing the strength of the connection between the bonding-pad conduction layer 5 and the conduction layer 3.

The main plasma is generated in the lower chamber 19. The apparatus functions in RIE mode because the grid 17, which is at the upper end of the lower chamber 19, is grounded. The apparatus is a compound TRIODE type, functioning in the upper chamber 18 by the application of high frequency to the electrode 14 (PLASMA), and functioning in the lower chamber 19 by the application of high frequency to the lower electrode 16 (RIE). The aforementioned "RIE" is a physical etching involving, for example, the energy of $C_2F_6 \rightarrow CF_x^+$ ions. The aforementioned "PLASMA" is a type of etching which involves the generated $CF_x$ and F radicals.

RF power is applied to the lower electrode 16 through the matching box 24. The nitrogen plasma generated in this process causes the formation of aluminum nitride AlN on the aluminum surface of a conductive layer. The end sensor 29 senses the end of the contact-hole etching process and ensures a stabilized process.

The use of the procedure illustrated in FIG. 4, which is a plasma treatment involving nitrogen, suppresses the generation of $AlF_m(OH)_{3-m}$ in the air after the formation of contact holes (the procedure illustrated in FIG. 3). As a result, even if exposure to air takes place for a long period of time before the following formation of the bonding-pad conduction layer 5 (the procedure illustrated in FIG. 6), there will be no increase in contact resistance between the bonding-pad conduction layer 5 and the conduction layer 3, which is extremely advantageous in terms of procedure control.

The effects of the aforementioned operations will be described below with reference to experiments.

Immediately following the formation of contact holes (the procedure illustrated in FIG. 3) under the conditions illustrated in the following Table II, a plasma treatment involving nitrogen gas (the procedure illustrated in FIG. 4) was carried out, followed by exposure to air. A microscope was then used to determine the number of $AlF_m(OH)_{3-m}$ particles per $(128~\mu m)^2$ relative to the length of exposure time in the area of the conduction layer 3 exposed by the contact hole 4a. The device used was a GCA WE-616 triode etch system. The upper electrode was coated with alumina ($Al_2O_3$) and the intermediate electrode (the grid) was composed of aluminum.

TABLE II

|  | Plasma etching | Nitrogen gas plasma treatment |
| --- | --- | --- |
| $C_2F_6$ gas supply | 20 cc./min. | 0 |
| $CHF_3$ gas supply | 140 cc./min. | 0 |
| Nitrogen gas supply | 0 | 170 cc./min. |
| High-frequency output | 400 W | 400 W |
| Pressure | 150 mtorr. | 300 mtorr. |
| Helium gas (for cooling wafer from below) | 7.0 torr. | 7.0 torr. |
| Temperature | 12° C. | 12° C. |
| Treatment time | Approximately 200 sec. | 15 sec. |
| High-frequency mode | RIE full mode | RIE full mode |

Figure 9:
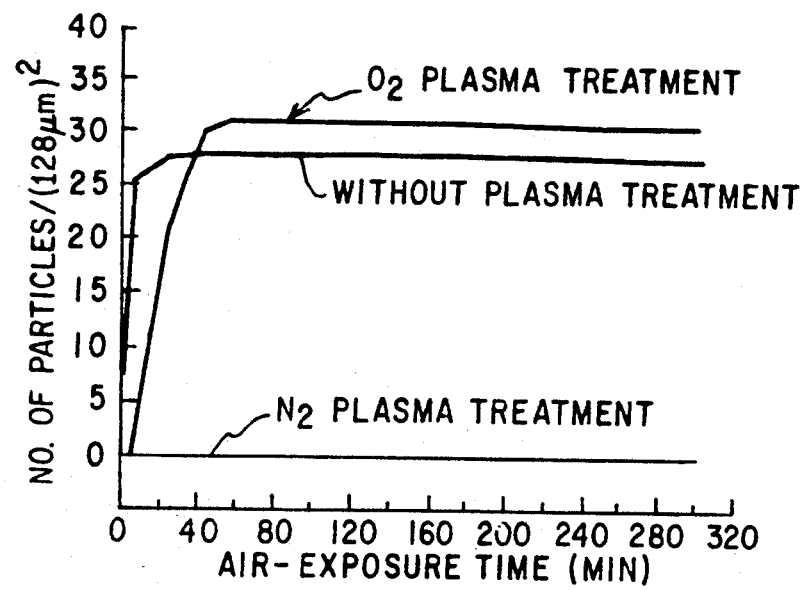
FIG. 9 is a graphical representation of the number of particles present per given area of an exposed portion of a conduction layer in relation to the time increments in which the conduction layer was exposed to air before the next deposition of a secondary conduction layer, and showing the comparative results obtained with a nitrogen plasma treatment following etching of a through hole with a flourine-based gaseous plasma, an oxygen plasma treatment, and without additional treatment.

The results are shown in Table III and FIG. 9. Table III and FIG. 9 also show the results obtained when the same experiment was carried out, for comparison, without using the plasma treatment involving nitrogen gas, as well as when a plasma treatment involving oxygen gas was used in place of the plasma treatment involving nitrogen gas.

TABLE III

| Expo* Time (min.) | Without nitrogen plasma treatment No. of particles /$(128~\mu m)^2$ | | | | Oxygen plasma treatment No. of particles /$(128~\mu m)^2$ | | | | Nitrogen plasma treatment No. of particles /$(128~\mu m)^2$ | | | |
| --- | --- | --- | --- | --- | --- | --- | --- | --- | --- | --- | --- | --- |
|  | 1 | 2 | 3 | Avg. | 1 | 2 | 3 | Avg. | 1 | 2 | 3 | Avg. |
| 2 | 10 | 6 | 7 | 7.7 | 0 | 0 | 0 | 0.0 | 0 | 0 | 0 | 0.0 |
| 5 | 29 | 20 | 28 | 25.7 | 0 | 0 | 0 | 0.0 | 0 | 0 | 0 | 0.0 |
| 10 | 29 | 21 | 28 | 26.0 | 5 | 3 | 5 | 4.3 | 0 | 0 | 0 | 0.0 |
| 15 | 30 | 22 | 28 | 26.7 |  |  |  |  | 0 | 0 | 0 | 0.0 |
| 20 | 30 | 23 | 29 | 27.3 | 14 | 16 | 20 | 16.7 | 0 | 0 | 0 | 0.0 |
| 30 | 30 | 24 | 29 | 27.7 | 22 | 20 | 32 | 24.7 | 0 | 0 | 0 | 0.0 |
| 45 | 30 | 24 | 29 | 27.7 | 32 | 24 | 35 | 30.3 | 0 | 0 | 0 | 0.0 |
| 60 | 30 | 24 | 29 | 27.7 | 32 | 25 | 36 | 31.0 | 0 | 0 | 0 | 0.0 |
| 120 | 30 | 24 | 29 | 27.7 | 32 | 25 | 36 | 31.0 | 0 | 0 | 0 | 0.0 |
| 150 | 31 | 24 | 29 | 28.0 | 32 | 25 | 36 | 31.0 | 0 | 0 | 0 | 0.0 |
| 300 | 31 | 24 | 29 | 28.0 | 32 | 25 | 37 | 31.3 | 0 | 0 | 0 | 0.0 |

*Expo = Exposure

Figure 21:
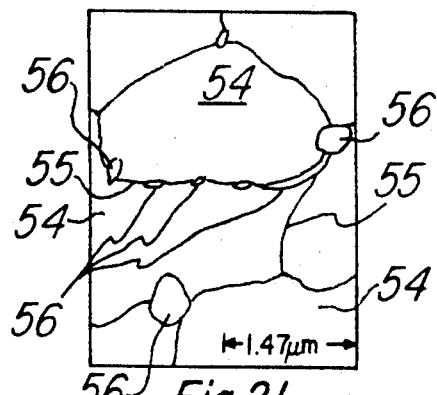
FIG. 21 is an illustration of an electron microscope composition of the surface of a portion of a conduction layer exposed by a through-hole in a partially completed semiconductor device made in accordance with conventional procedure.
Figure 22:
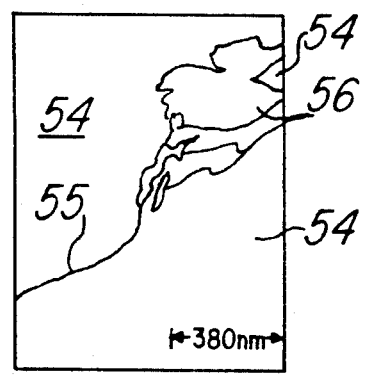
FIG. 22 is an illustration similar to FIG. 21, but showing the same electron microscope composition at a higher degree of magnification.

When plasma treatment using nitrogen gas was not carried out, the generation of $AlF_m(OH)_{3-m}$ particles was observed within several seconds of exposure to air. FIG. 21 is a sketch of the electron microscope analysis of the composition for this example, and FIG. 22 is a sketch of the same at a higher magnification. FIGS. 21 and 22 show the grain boundary 55 of an aluminum crystal grain 54. This is observable because a particularly large $AlF_m(OH)_{3-m}$ particle 56 is generated at the triple point of the aluminum grain boundary. When a plaxma treatment using oxygen gas was used in place of the plasma treatment using nitrogen gas, particle generation was slower than when no treatment was used at all. However, after 60 minutes, the number of particles had increased beyond that obtained when no treatment was used. When a plasma treatment using nitrogen gas was used, no particles were observed after 300 minutes; this condition was maintained even after 29 hours.

The aforementioned results for the nitrogen plasma treatment are believed to reflect the formation of aluminum nitride (AlN) on the aluminum-copper alloy conduction layer surface due to nitrogen ions in the plasma. The following scheme is surmised for the reaction taking place in this location.

The aforementioned formulae are believed to show the most natural reaction scheme for the aluminum-copper alloy surface reaction, given the coupling bond energies of each substance. (It should be noted in reference that the C—O coupling energy is 256.7 kcal/mol)

The results of an analysis by ESCA (electron spectroscopy for chemical analysis) of the modification of the conduction-layer surface following the nitrogen plasma treatment will now be described. The specimen analyzed was the conductive surface, following the formation of contact holes through fluorine-based gas plasma etching, used as a reference specimen. Nitrogen plasma treatments were carried out for 15 sec. and 200 sec.

Figure 10:
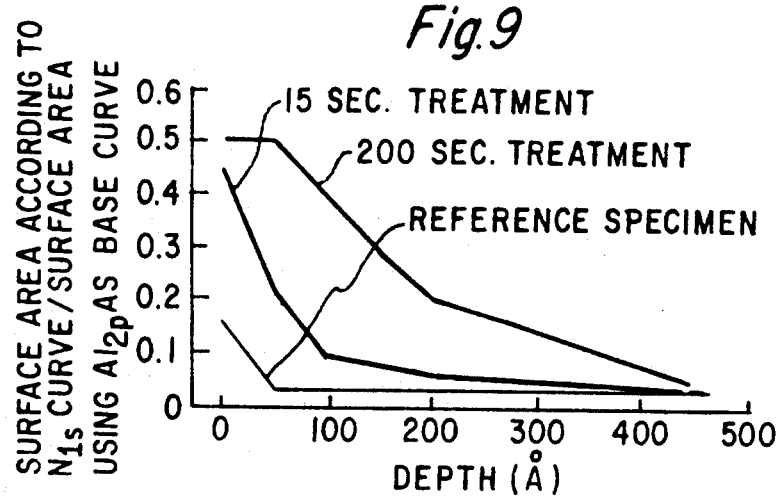
FIG. 10 is a graphical representation of surface area as subjected to a nitrogen plasma in relation to depth of penetration of nitrogen as depicted over a relatively short nitrogen plasma treatment and a relatively long nitrogen plasma treatment, in comparison to a reference specimen, and illustrating the analysis results of an ESCA of the nitrogen.
Figure 11:
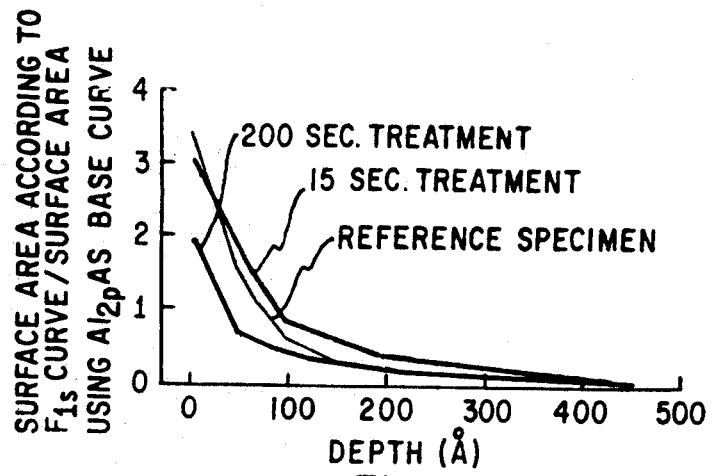
FIG. 11 is a graphical representation similar to FIG. 10, but showing the surface area according to the flourine-based gaseous plasma and the depth of penetration of flourine, and illustrating the analysis results of an ESCA of the flourine.
Figure 12:
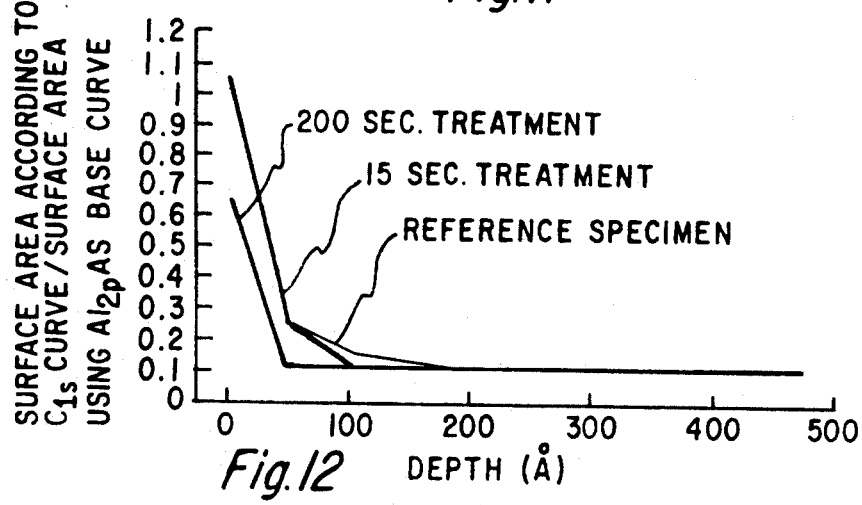
FIG. 12 is a graphical representation similar to that of FIGS. 10 and 11, but illustrating the analysis results of an ESCA of carbon.

The results are shown below in Table IV and FIGS. 10-12.

TABLE IV

| | Scan* Time (sec.) | Depth (Å) | \multicolumn{6}{c}{Elements in F-based gas plasma etching area} | | | | | |
|---|---|---|---|---|---|---|---|---|
| | | | $C_{1s}$ | $O_{1s}$ | $Al_{2p}$ | $F_{1s}$ | $N_{1s}$ | $Cu_{1MM}$ |
| After | 0.0 | 0 | 1.07 | 0.49 | 1.00 | 3.45 | 0.16 | 0.19 |
| F- | 0.5 | 50 | 0.26 | 0.17 | 1.00 | 1.47 | 0.03 | 0.23 |
| based | 1.0 | 100 | 0.17 | 0.20 | 1.00 | 0.53 | 0.03 | 0.19 |
| gas | 2.0 | 200 | 0.11 | 0.19 | 1.00 | 0.18 | 0.03 | 0.20 |
| plasma | 4.5 | 450 | 0.10 | 0.20 | 1.00 | 0.04 | 0.04 | 0.11 |
| etching | | | | | | | | |
| (ref. spec.)* | | | | | | | | |
| $N_2$ | 0.0 | 0 | 1.05 | 0.60 | 1.00 | 3.13 | 0.45 | 0.19 |
| plasma | 0.5 | 50 | 0.25 | 0.29 | 1.00 | 1.81 | 0.21 | 0.18 |
| etching | 1.0 | 100 | 0.13 | 0.24 | 1.00 | 0.79 | 0.09 | 0.21 |
| (15 | 2.0 | 200 | 0.12 | 0.21 | 1.00 | 0.39 | 0.06 | 0.18 |
| sec.) | 4.5 | 450 | 0.11 | 0.19 | 1.00 | 0.08 | 0.04 | 0.13 |
| $N_2$ | 0.0 | 0 | 0.68 | 0.41 | 1.00 | 2.02 | 0.50 | 0.13 |
| plasma | 0.5 | 50 | 0.13 | 0.21 | 1.00 | 0.66 | 0.50 | 0.11 |
| etching | 1.0 | 100 | 0.14 | 0.21 | 1.00 | 0.40 | 0.39 | 0.17 |
| (200 | 2.0 | 200 | 0.11 | 0.23 | 1.00 | 0.17 | 0.20 | 0.17 |
| sec.) | 4.5 | 450 | 0.10 | 0.19 | 1.00 | 0.06 | 0.06 | 0.18 |

*Scan = Scanning
ref. spec. = reference specimen

The values shown in Table IV indicate the amount of change in each element, using $Al_{2p}$ as a base.

The results for $N_{1s}$, $F_{1s}$, and $C_{1s}$ will now be examined. For $N_{1s}$, the presence of nitrogen compounds was confirmed only on the extreme surface, and the number of electrons was low, at 626 cps. This is believed to be $NO_x$. When this is subjected to the nitrogen plasma treatment, a change in the nitrogen depth direction is observed, according to the length of treatment time (FIG. 10). In addition, for $F_{1s}$ and $C_{1s}$ as well, reductions on the surface were observed according to the length of nitrogen gas plasma treatment time (FIGS. 11 and 12).

Next, the generated compounds were specified by chemical shift relative to $Al_{2p}$. The results are shown below in Table V.

TABLE V

| After F-based gas plasma treatment | Depth (Å) | $Al_{2p}$ (%) | | | Total peak area (%) | Gas comp* |
|---|---|---|---|---|---|---|
| | | $AlF_3$ 77 eV | AlN 74 eV | Al 72 eV | | |
| $N_2$ plasma treatment 0 sec. (ref. spec.)* | 0 | 77.41 | 5.74 | 11.36 | 94.51 | $CHF_3$/ $C_2F_6$ |
| | 50 | 60.47 | 0 | 38.51 | 98.98 | |
| | 100 | 37.42 | 0 | 48.69 | 86.11 | |
| $N_2$ plasma treatment 15 sec. | 0 | 77.15 | 5.49 | 6.27 | 88.91 | $CHF_3$/ $C_2F_6$ +$N_2$ |
| | 50 | 71.61 | 0 | 24.87 | 96.48 | |
| | 100 | 59.05 | 0 | 39.27 | 98.32 | |
| $N_2$ plasma treatment 200 sec. | 0 | 59.87 | 34.44 | 2.93 | 97.24 | $CHF_3$/ $C_2F_6$ +$N_2$ |
| | 50 | 75.36 | 7.98 | 12.29 | 95.63 | |
| | 100 | 55.45 | 15.26 | 24.86 | 95.57 | |

*ref. spec. = reference specimen
comp = composition
Note: In Table V, eV denotes coupling energy.

Based on Table V, it is believed that AlN is present only on the extreme surface in the reference specimen and the specimen in which the nitrogen plasma treatment time was short, at 15 sec. In contrast, with the specimen in which the nitrogen plasma treatment time was long, at 200 sec., the AlN data and the $N_{1s}$ data in Table IV make it clear that nitriding has occurred to a considerable depth. Although Table V only shows the data up to a depth of 100 Å, it has been confirmed that nitriding occurred to a depth of 300 Å in this specimen.

The aforementioned ESCA analysis results make it clear that after the contact holes are formed by fluorine-based gas plasma etching, the aluminum-copper alloy surface is active and is thus in a state in which corrosion can occur easily. A nitrogen plasma treatment serves to modify the surface through the generation of AlN. It is believed that this has the effect, after the subsequent formation of a bonding-pad conduction layer, of preventing an increase in electrical resistance between the bonding-pad conduction layer and the aluminum-copper alloy conduction layer, thereby ensuring the quality of the semiconductor device.

Results from measurements of contact resistance between the CMOS-logic conduction layer and the bonding-pad conduction layer will now be explained.

In place of a single CMOS logic element, 5 test areas were formed on a single wafer used to manufacture a large number of CMOS logic elements. Next, bonding pads were formed in 2 locations in each test area. These test areas were connected in series by a contact combination. The synthesized contact resistance was then measured by probing. Plasma cleaning-time periods, following contact hole formation and prior to conduction layer adhesion, were 60 sec., 120 sec., and 180 sec. The nitrogen gas plasma treatments were 15 sec. and 45 sec. long. Measurements were made on 47 wafers.

The measurement results are shown below in Table VI. As a comparison, Table VI also shows the same type of measurement results for a case in which the nitrogen plasma treatment was not carried out. It should be noted that the bonding-pad conduction layer included in the test areas from which the data provided in Table VI was obtained was formed after exposure to air for several minutes, following the formation of thru-holes by fluorine-based gas plasma etching treatment and subsequent treatment of the thru-holes by nitrogen plasma.

TABLE VI

| N₂ plasma treatment | | Contact resistance Plasma cleaning time | | |
|---|---|---|---|---|
| | | 60 sec. | 120 sec. | 180 sec. |
| Without N₂ plasma treatment | Average value | 441.4 | 449.6 | 630.1 |
| | Maximum value | 546 | 606 | 920 |
| | Minimum value | 370 | 332 | 415 |
| | Std deviation | 45.15 | 69.88 | 120.3 |
| 15 sec. | Average value | 408.5 | 401.9 | 571 |
| | Maximum value | 475 | 559 | 901 |
| | Minimum value | 343 | 327 | 395 |
| | Std deviation | 37.58 | 56.95 | 136.7 |
| 45 sec. | Average value | 408.4 | 371.8 | 446.2 |
| | Maximum value | 504 | 483 | 620 |
| | Minimum value | 348 | 317 | 343 |
| | Std deviation | 42.39 | 47.34 | 84.93 |

The following points are apparent from the data provided by Table VI.

The longer the plasma cleaning time before adhesion of the conduction layer, the greater the contact resistance. In addition, as the nitrogen plasma treatment time is increased, there is a slight decrease in contact resistance.

As described above, the nitrogen plasma treatment causes aluminum nitride (AlN) to be generated on the boundary. Since AlN is insulating, there is a change in the contact resistance, depending on the length of time of the subsequent plasma cleaning procedure, which precedes the conduction layer adhesion procedure. Thus, contact resistance is reduced below the level in the comparative example (reference specimen), in which the nitrogen plasma treatment is not used, by selecting the proper plasma cleaning time with respect to the nitrogen plasma treatment time.

However, when nitrogen plasma treatment is not used, if air exposure is continued up to the point at which the bonding-pad conduction layer is formed, then the contact resistance will increase beyond the values shown in Table VI. In contrast, when the nitrogen plasma treatment is carried out, there will be no increase in contact resistance, even if the aforementioned air exposure time is long, thus making procedure control easy.

Embodiments of the present invention as previously described may be varied based on the technological ideas of the present invention, within the scope of the invention.

For example, the same effects as previously described may be obtained by using, in place of the aluminum-copper alloy (2 wt % Cu), an alloy of the same base with a different copper content, or an aluminum-silicon-copper alloy (with, for example, 1 wt % Si and 0.5 wt % Cu), as the conductive material. If such a three-element alloy is used to create the conduction layer, then the differences in the standard electrode potentials between the layers will allow the reaction to proceed in air after a fluorine-based gas plasma etching treatment.

Figure 13:
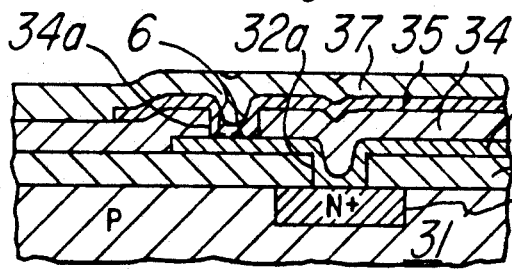
FIG. 13 is an enlarged partial cross-sectional view showing a semiconductor device as made by another embodiment of the method in accordance with the present invention.

In addition, as shown in FIG. 13, the present invention may be applied to the manufacture of a variety of semiconductor devices with different structures, such as one in which an $SiO_2$ primary-interlayer insulation layer 32, a primary conduction layer 33, an $SiO_2$ secondary-interlayer insulation layer 34, a secondary conduction layer 35, and a protection layer 37, e.g., one composed of tantalum oxide ($Ta_2O_5$) and with excellent friction wear resistance, are adhered, in said order, onto a P-type wafer or substrate 31. The N+ region 31a of the substrate 31 the primary conduction layer 33, and the secondary conduction layer 35 are electrically connected via thru-holes 32a and 34a in the respective primary-interlayer insulation layer 32 through which the primary conduction layer 33 extends into engagement with the N+ region 31a, and the secondary-interlayer insulation layer 34 through which the secondary conduction layer 35 extends into engagement with the primary conduction layer 33.

In addition, in the previous description of the embodiments of the invention, the fluorine-based gas plasma etching treatment and the nitrogen plasma treatment were carried out in the same chamber. However, it is also possible to carry out the two treatments in separate chambers within the same device.

FIGS. 14–17 illustrate examples in which the surface is flattened.

Figure 14:
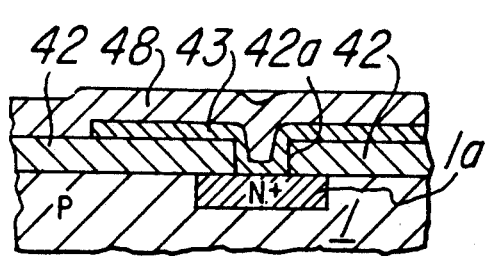
FIG. 14 is an enlarged partial cross-sectional view illustrating an early stage in another embodiment of the method of making a semiconductor device in accordance with the present invention.

First, as shown in FIG. 14, a primary-interlayer insulation layer (BPSG film) 42, a primary conduction layer 43 and a TEOS film 48 are adhered, in that order, onto the wafer or substrate 1.

Figure 15:
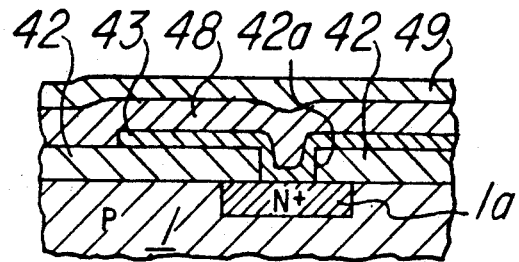
FIG. 15 is an enlarged partial cross-sectional view, similar to FIG. 14, but illustrating a subsequent procedure in the method of making a semiconductor device.
Figure 16:
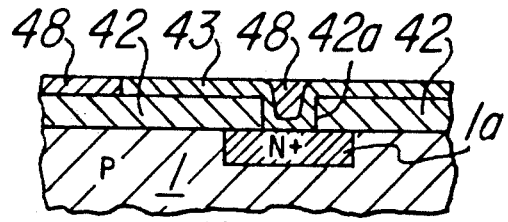
FIG. 16 is an enlarged partial cross-sectional view, of the embodiment of the method of making a semiconductor device as shown in FIGS. 14 and 15, but illustrating a further procedure subsequent to that shown in FIG. 15.

Next, as shown in FIG. 15, a resistor or SOG (spin-on glass) 49 is applied over the entire surface of the TEOS film 48 in order to produce a flattened outer surface. Next, a fluorine-based gas plasma treatment is carried out to etch the entire surface, thereby flattening the surface, as shown in FIG. 16. Next, the method of the present invention is applied so that the generation of reaction products is controlled, even in the areas in which the primary conduction layer 43 is exposed, during the exposure to air, which continues until the following procedure.

Figure 17:
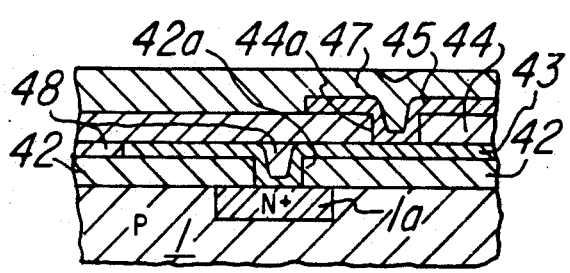
FIG. 17 is an enlarged partial cross-sectional view, of the embodiment of the method as shown in FIGS. 14–16, but illustrating a further procedure subsequent to that shown in FIG. 16.

Next, as shown in FIG. 17, a structure is produced in which a secondary-interlayer insulation layer 44, a secondary conduction layer 45 and a silicon-nitride or silicon-oxide protection layer 47 are deposited in that order. The N+ region 1a of the substrate 1 and the primary and secondary conduction layers 43, 45 are electrically connected via thru-holes 42a and 44a in the respective primary-interlayer insulation layer 42 through which the primary conduction layer 43 extends into engagement with the N+ region 1a, and the secondary-interlayer insulation layer 44 through which the secondary conduction layer 45 extends into engagement with the primary conduction layer 43. The bonding pads (not shown) are formed by a standard photolithographic procedure and an etching procedure carried out on the protection layer 47.

An example in which the protection layer component is formed in two layers will now be described.

The bonding pads are formed after the procedures illustrated FIGS. 14–17. If the protection-layer component is composed of silicon oxide or silicon nitride, it is possible to apply the method of the present invention since fluorine gas is used in the etching.

Figure 18:
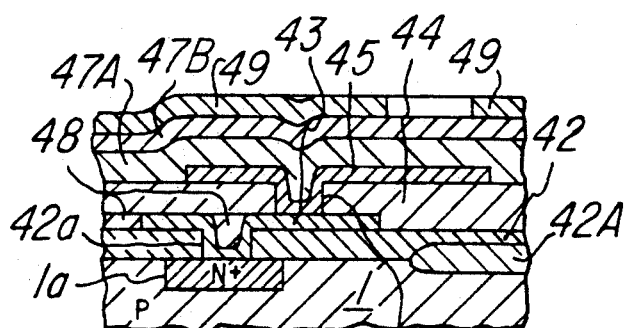
FIG. 18 is an enlarged partial cross-sectional view, illustrating an early stage in another embodiment of the method of making a semiconductor device.
Figure 19:
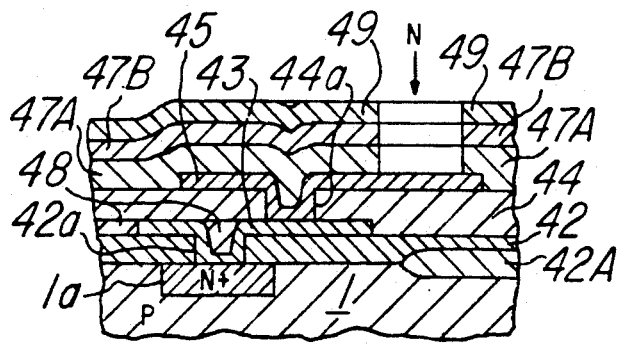
FIG. 19 is an enlarged partial cross-sectional view, similar to FIG. 18, but illustrating a subsequent procedure in the method of making a semiconductor device.

As shown in FIGS. 18 and 19, when the protection-layer component is comprised of two layers 47A and 47B, with a first silicon-nitride film or silicon-oxide film 47A on the bottom and then a second silicon-oxide film or silicon-nitride film 47B on top, a standard photolithographic procedure is carried out; the etching procedure comprises etching with fluorine gas, followed by a plasma treatment. In FIGS. 18 and 19, a resistor layer 49 is provided on the upper film 47B of the two-layer protection layer component and an oxide film 42A with a LOCOS structure is provided between the substrate 1 and the primary-interlayer insulation layer 42.

The method of making a semiconductor device in accordance with the present invention involves a procedure for treating a thru-hole as etched in an insulation layer by a fluorine-based gas plasma with a plasma treatment involving a gas containing nitrogen. Thus, even when the partially finished semiconductor device is exposed to air after this nitrogen plasma treatment procedure, it is possible to suppress the generation of reaction products, which increase electrical resistance, wherein these reaction products are generated by a reaction between components in the air, components in the fluorine-based gas used in the etching procedure and components in the conduction-layer material exposed by the etching procedure. As a result, even if the aforementioned partially finished semiconductor device is exposed to air for a long period of time following the nitrogen plasma treatment procedure, there is no increase in contact resistance between the aforementioned conduction layer and another conduction layer formed in a later procedure; therefore, the quality of the semiconductor device is ensured. In addition, there is no necessity for the aforementioned air exposure-time period to be extremely short, which is highly advantageous in terms of procedure control by relaxing otherwise demanding time constraints with respect to the subsequent deposition of another conduction layer.

We claim:

1. A method for making a semiconductor device comprising:
    etching a contact hole through an insulation layer overlying a first conduction layer disposed on a substrate of semiconductor material to selectively expose a surface portion of the first conduction layer by employing an etchant gas having a tendency to react with the underlying first conduction layer and form reaction products on the selectively exposed surface portion of the first conduction layer increasing the contact resistance thereof;
    flooding the etched contact hole immediately following its formation with a gaseous medium covering the area of the selectively exposed surface portion of the first conduction layer and capable of inhibiting the formation of reaction products on the selectively exposed surface portion of the first conduction layer from the original etchant gas;
    suppressing the formation of resistance-increasing reaction products on the selectively exposed surface portion of the first conduction layer in dependence upon the flooding of the etched contact hole with the gaseous medium;
    exposing the etched contact hole to air following the flooding of the etched contact hole with the gaseous medium; and
    depositing a second conduction layer onto the insulation layer and extending through the contact hole formed therethrough into engagement with the selectively exposed surface portion of the first conduction layer.

2. A method as set forth in claim 1, wherein etching of the contact hole through the insulation layer is accomplished by employing a fluorine-based gaseous plasma as the etchant gas;
    the flooding of the etched contact hole immediately following its formation with a gaseous medium being accomplished by treatment of the etched contact hole with a nitrogen-containing plasma.

3. A method for making a semiconductor device as set forth in claim 2, wherein the first conduction layer comprises an aluminum-copper alloy.

4. A method for making a semiconductor device as set forth in claim 3, wherein the treatment of the contact hole with the nitrogen-containing plasma suppresses the generation of $AlF_m(OH)_{3-m}$ in the air after the contact hole has been etched by employing the fluorine-based gaseous plasma.

5. A method for making a semiconductor device as set forth in claim 1, further including depositing a second insulation layer onto the second conduction layer;
    etching a contact hole through said second insulation layer overlying said second conduction layer to selectively expose a surface portion of said second conduction layer by employing the etchant gas having a tendency to react with the underlying second conduction layer and form reaction products on the selectively exposed surface portion of the second conduction layer increasing the contact resistance thereof;
    flooding the etched contact hole in the second insulation layer immediately following its formation with a gaseous medium covering the area of the selectively exposed surface portion of said second conduction layer and capable of inhibiting the formation of reaction products on the selectively exposed surface portion of said second conduction layer from the original etchant gas;
    suppressing the formation of resistance-increasing reaction products on the selectively exposed surface portion of said second conduction layer in dependence upon the flooding of the etched contact hole with the gaseous medium;
    wherein the selectively exposed surface portion of said second conduction layer is employed as a bonding pad.

6. A method for making a semiconductor device as set forth in claim 3, wherein the etchant gas employed in etching the contact hole through said second insulation layer is a fluorine-based gaseous plasma; and
    the gaseous medium employed in flooding the etched contact hole in said second insulation layer is a nitrogen-containing plasma.

* * * * *